United States Patent
Sharma (10) Patent No.: US 6,921,954 B2
(45) Date of Patent: Jul. 26, 2005

(54) ASYMMETRIC PATTERNED MAGNETIC MEMORY

(75) Inventor: Manish Sharma, Mountain Veiw, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/932,693

(22) Filed: Sep. 1, 2004

(65) Prior Publication Data

US 2005/0073016 A1 Apr. 7, 2005

Related U.S. Application Data

(62) Division of application No. 10/677,394, filed on Oct. 1, 2003, now Pat. No. 6,794,697.

(51) Int. Cl.[7] ............................................... H01L 29/82
(52) U.S. Cl. ...................... 257/421; 365/171; 257/390; 257/421; 257/295; 438/3; 438/5
(58) Field of Search .......................... 365/171; 257/390, 257/421, 295; 438/3, 5

(56) References Cited

U.S. PATENT DOCUMENTS

2003/0063492 A1 * 4/2003 Ruhrig et al.

* cited by examiner

*Primary Examiner*—David Nelms
*Assistant Examiner*—Mai-Huong Tran (57) ABSTRACT

This invention provides an asymmetrically patterned magnetic memory storage device. In a particular embodiment at least one magnetic memory cell is provided. Each magnetic memory cell provides at least one ferromagnetic data layer of a first size, the data layer characterized by an alterable orientation of magnetization, an intermediate layer in contact with the data layer and at least one ferromagnetic reference layer of a second size, the reference layer characterized by a reference magnetic field. The reference layer is in contact with the intermediate layer, opposite from and asymmetric to the data layer. The magnetic memory cell is characterized as having only one-end involvement. More specifically, the asymmetric alignment provides that only one set of magnetic poles are in substantial vertical alignment, and as such subject to the strong influence of one another.

6 Claims, 5 Drawing Sheets

ASYMMETRIC PATTERNED MAGNETIC MEMORY

This application is a division of Ser. No. 10/677,394 filed Oct. 1, 2003 U.S. Pat. No. 6,794,697.

FIELD OF THE INVENTION

This invention relates generally to magnetic memory devices and in particular to ultra-high density asymmetrical magnetic random access memory (commonly referred to as "MRAM").

BACKGROUND OF THE INVENTION

Today's computer systems are becoming increasingly sophisticated, permitting users to perform an ever greater variety of computing tasks at faster and faster rates. The size of the memory and the speed at which it can be accessed bear heavily upon the overall speed of the computer system.

Generally, the principle underlying the storage of data in a magnetic media (main or mass storage) is the ability to change, and/or reverse, the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle the higher it's coercivity.

A prior art magnetic memory cell may be a tunneling magneto-resistance memory cell (TMR), a giant magneto-resistance memory cell (GMR), or a colossal magneto-resistance memory cell (CMR). These types of magnetic memory are commonly referred to as magnetic tunnel junction memory (MTJ). As shown in prior art FIG. 1A and 1B a magnetic tunnel junction memory 100 generally includes a data layer 101 (also called a storage layer or bit layer), a reference layer 103, and an intermediate layer 105 between the data layer 101 and the reference layer 103. The data layer 101, the reference layer 103, and the intermediate layer 105 can be made from one or more layers of material.

Figure 1A:
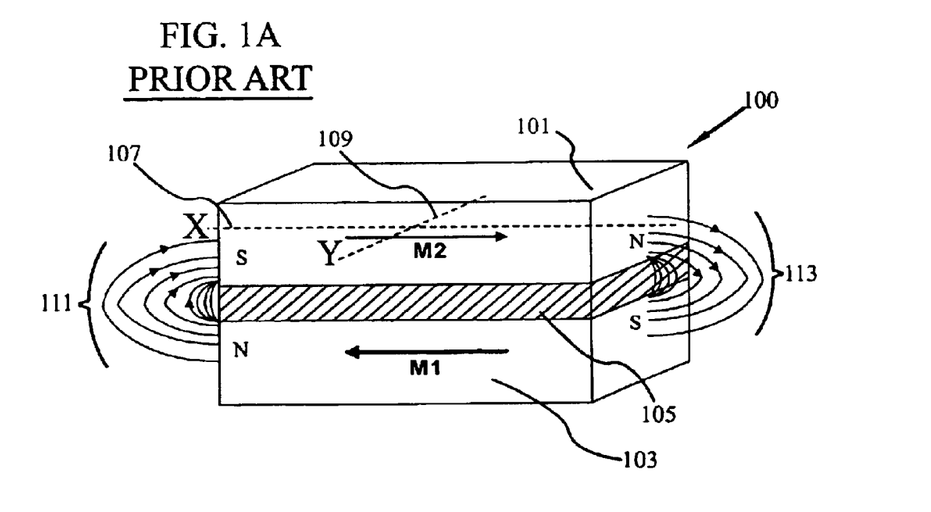
FIGS. 1A–1B show perspective views of a prior art magnetic memory cell having symmetric layers with anti-parallel and parallel magnetic fields.
Figure 1B:
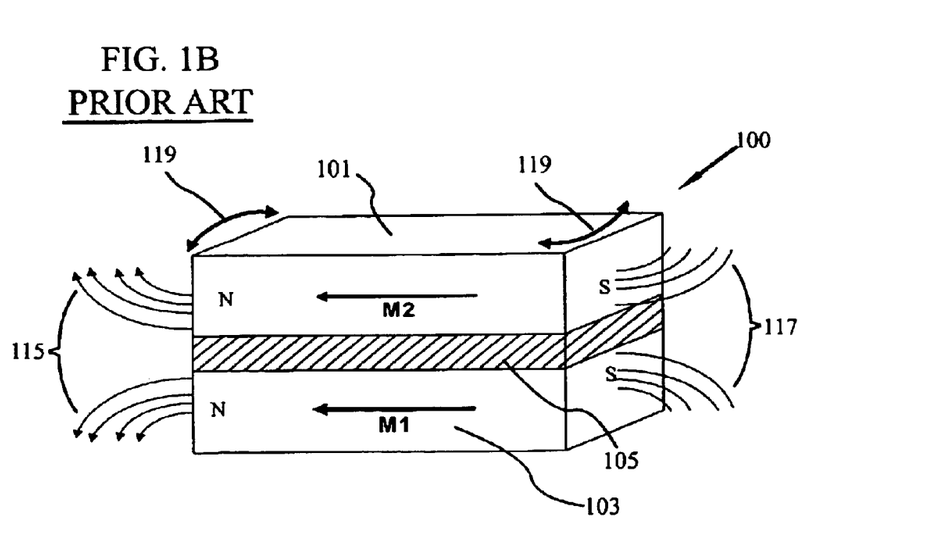

The data layer 101 is usually a layer of magnetic material that stores a bit of data as an orientation of magnetization M2 that may be altered in response to the application of an external magnetic field or fields. More specifically, the orientation of magnetization M2 of the data layer 101 representing the logic state can be rotated (switched) from a first orientation representing a logic state of "0" to a second orientation, representing a logic state of "1", and/or vice versa.

The reference layer 103 is usually a layer of magnetic material in which an orientation of magnetization M1 is "pinned", as in fixed, in a predetermined direction. Often several layers of magnetic material are required and function as one to effectuate a stable pinned reference layer 103. The direction is predetermined and established by microelectronic processing steps employed in the fabrication of the magnetic memory cell.

The data layer 101 and reference layer 103 may be thought of as stacked bar magnets, each long on the X axis 107 and short on the Y axis 109. The magnetization of each layer has a strong preference to align along the easy axis, generally the long X axis 107. The short Y axis 109 is the hard axis. As with traditional bar magnets, the data layer and reference layer each have magnetic poles, one at either end of the easy axis.

Figure 2A:
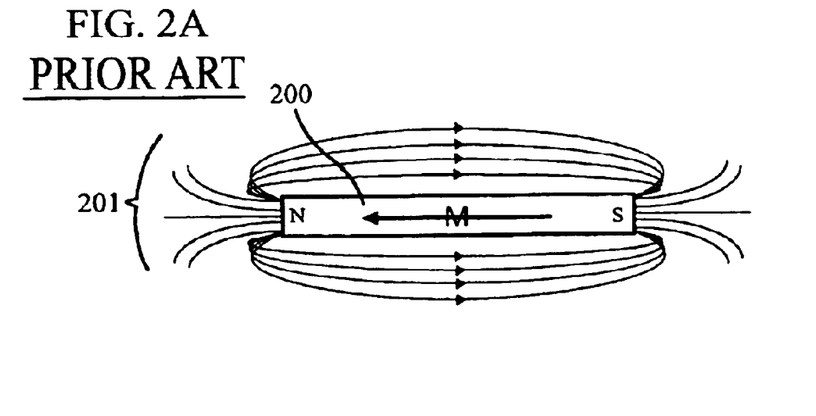
FIGS. 2A–2C conceptually illustrate the magnetic fields surrounding bar magnets.
Figure 2B:
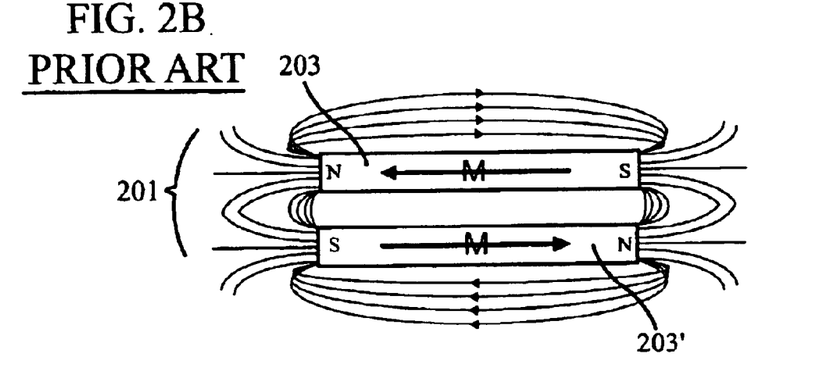
Figure 2C:
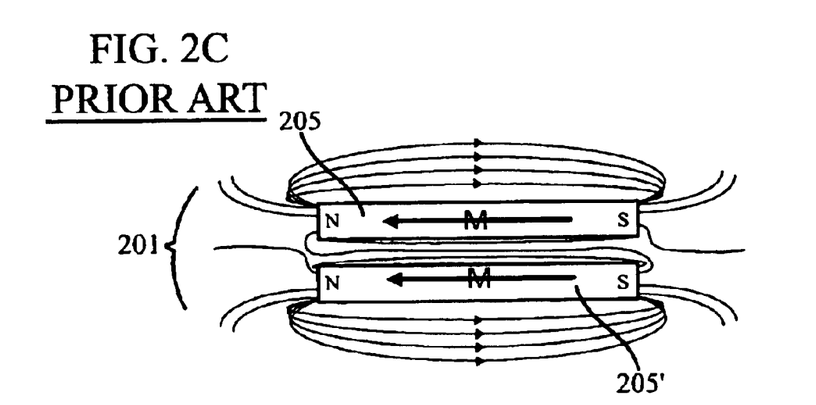

The lines of magnetic force that surround a bar magnet are three-dimensional and flow from the North to the South pole. FIG. 2A is a simplified side view illustration of a typical bar magnet 200, it's magnetic orientation M and the surrounding magnetic field also referred to as lines of force (represented by arrows 201). As is shown in FIGS. 2B and 2C, generally, like poles repel and unlike poles attract. When opposite poles of two bar magnets (203 and 203') are brought together, the lines of force 201 join up and pull the magnets together as in FIG. 2B. When like poles of two bar magnets (205 and 205') are brought together, the lines of force 201 push away from each other and the magnets repel each other as in FIG. 2C.

These forces are most pronounced at either pole. As a result when two bar magnets of substantially equal length are evenly stacked lengthwise, both poles either simultaneously attract or simultaneously repel as they are directly proximity to one another.

Typically, the logic state (a "0" or a "1") of a magnetic memory cell depends on the relative orientations of magnetization in the data layer 101 and the reference layer 103. For example, when an electrical potential bias is applied across the data layer 101 and the reference layer 103 in a MTJ 100, electrons migrate between the data layer 101 and the reference layer 103 through the intermediate layer 105. The intermediate layer 105 is typically a thin dielectric layer commonly referred to as a tunnel barrier layer. The phenomena that cause the migration of electrons through the barrier layer may be referred to as quantum mechanical tunneling or spin tunneling.

Continuing with the model of an elemental bar magnets, the magnetization of the data layer 101 is free to rotate, but with a strong preference to align in either direction along the easy axis 107 of the data layer 101. The reference layer 103 likewise is aligned along the easy axis 107 of the reference layer 103, but is pinned in a fixed alignment. The logic state may be determined by measuring the resistance of the memory cell. For example, if the overall orientation of the magnetization in the data layer 101 is parallel to the pinned orientation of magnetization in the reference layer 103 the magnetic memory cell will be in a state of low resistance. If the overall orientation of the magnetization in the data layer 101 is anti-parallel (opposite) to the pinned orientation of magnetization in the reference layer 103 the magnetic memory cell will be in a state of high resistance.

As the data layer 101 and reference layer 103 are substantially equal in length, and as the physical ends of the data layer 101 and reference layer 103 are symmetrically aligned, the poles of each layer are also proximate to one another. When the magnetic fields M1 and M2 are anti-parallel, as in FIG. 1A, there exists a strong magnetic attraction between both ends as illustrated by joined field lines 111 and 113. When the magnetic fields M1 and M2 are parallel, as in FIG. 1B, the magnetic fields emanating from the poles repel one another, as illustrated by field lines 115 and 117. As the poles are pre-disposed to attract, there is a strong desire for both poles of the data layer 101 to rotate away from their matching pole in the reference layer 103, as represented by arrows 119. This symmetric set of forces operating upon both ends of the data layer 101 and reference layer 103 at substantially the same time may be described simplistically as "two-end involvement."

Storing a binary one or zero in the data layer 101 may require the orientation of the data layer 101 to be rotated, an event that may force the like poles to align, a condition they will fight, or permit opposite poles to align, a condition they desire. In either case, both poles of the data layer 101 and the reference layer 103 are involved and must be coerced to accept the new orientation. While the attraction between the poles reduces the required field to shift the orientation into anti-parallel, the repulsion at both ends requires a greater field to shift the orientation into parallel.

In an ideal setting the orientation of the alterable magnetic field in the data layer 101 would be either parallel or anti-parallel with respect to the field of the reference layer 103. As the data layer 101 and the reference layer 103 are generally both made from ferromagnetic materials and are positioned in close permanent proximity to each other, the generally stronger reference layer 103 may affect the orientation of the data layer 101. More specifically, the magnetization of the reference layer 103 may generate a demagnetization field that extends from the reference layer 103 into the data layer 101.

The result of this demagnetization field from the reference layer 103 is an offset in the coercive switching field. This offset can result in asymmetry in the switching characteristics of the bit: the amount of switching field needed to switch the bit from parallel to anti-parallel state is different from the switching field needed to switch the bit from anti-parallel state to parallel state. To have reliable switching characteristics and to simplify the read/write circuitry, it is desirable to have this offset reduced to as near zero as possible.

The magneto-resistance $\Delta R/R$ may be described as akin to a signal-to-noise ratio S/N. A higher S/N results in a stronger signal that can be sensed to determine the state of the bit in the data layer 101. Thus, at least one disadvantage of a tunnel junction memory cell having a pinned reference layer 103 in close and fixed proximity to the data layer 101 is a potential reduction in the magneto-resistance $\Delta R/R$ resulting from the angular displacement.

To pin the reference layer 103 during manufacturing, the reference layer 103 must be heated to an elevated temperature in an annealing step. The annealing step typically takes time, perhaps an hour or more. As the reference layer 103 is but one part of the memory being produced, the entire memory must be subject to temperatures ranging from about 200 to 300 degrees centigrade while under the influence of a constant and focused magnetic field. Such manufacturing stresses may permit the reference layer 103 to become un-pinned and lose it's set orientation if the memory is later subjected to high temperatures. In addition, the characteristics of the data layer 101 may be unknowingly affected by heat during some manufacturing processes.

To facilitate establishing a pinned reference layer 103 it is not uncommon for the reference layer 103 to include multiple layers of material. While utilizing multiple layers may help ensure that the reference layer 103 remains pinned, it also raises the complexity of manufacturing each and every memory cell present in the magnetic memory.

Main memory devices such as MRAM often employ tunnel junction magnetic memory cells positioned at the transverse intersections of electrically conductive rows and columns. Such an arrangement is known as a cross-point memory array.

In a typical cross-point memory array, while any given row (row A, B, C . . . ) may cross every column (column 1, 2, 3 . . . ), and visa-versa, the traditional principles of column and row arrays dictate that any given row will only cross any given column once. Therefore, by accessing a particular row (B) and a particular column (3), any one memory cell positioned at their intersection (B,3) can be isolated from any other memory cell in the array. Such individual indexing is not without complexities.

As between the two fundamental operations that may be performed on a storage bit (a "write" or a "read"), the write operation is generally more complex. With respect to traditional cross-point memory arrays, while the magnetic field of the data layer 101 of a desired cell may be altered, it is desirable not to adversely affect or alter the data layers 101 of neighboring cells. Write operations generally require greater electrical current and magnetic fields, requiring more robust characteristics in the power supply, row and column conductors and appropriate buffering space. Therefore, design and manufacturing issues are generally focused upon the requirements imposed by the write operation.

With respect to magnetic memory components, it is well known that as size decreases coercivity increases. A large coercivity is generally undesirable, as it requires a greater magnetic field to be switched, which in turn requires a greater power source and potentially larger switching transistors. Providing large power sources and large switching transistors is generally at odds with the focus of nanotechnology to reduce the necessary size of components. In addition, to mitigate the potential of inadvertently switching a neighboring memory cell, nanometer scaled memory cells are generally more widely spaced relative to their overall size than are non-nanometer sized memory cells. Moreover, as the size of the magnetic memory decreases, the unused space between individual memory cells tends to increase.

These issues and current design of the magnetic memory cells also carry over into the design and use of magnetic field sensors such as those commonly used in hard drive read cells and read heads. In such implementation, the data layer 101 is termed a sense layer and is oriented by the magnetic field emanating from a storage bit proximate to the read head. As two-end involvement is present, weakened or degraded data storage bits on the hard drive may not have a sufficient field to properly orient the sense layer.

Hence, in a typical MRAM array a significant amount of overall space may be used simply to provide a physical buffer between the cells. Absent this buffering space, or otherwise reducing it's ratio, a greater volume of storage in the same physical space could be obtained.

Hence, there is a need for an ultra-high density thermally assisted memory array which overcomes one or more of the drawbacks identified above. The present invention satisfies one or more of these needs.

SUMMARY

This invention provides an asymmetrically patterned magnetic memory storage device.

In particular, and by way of example only, according to an embodiment of the present invention, this invention provides an asymmetrically patterned magnetic device including: at least one ferromagnetic data layer of a first size, the data layer characterized by an alterable orientation of magnetization; an intermediate layer in contact with the data layer; and at least one ferromagnetic reference layer of a second size, the reference layer characterized by a reference magnetic field, the reference layer in contact with the intermediate layer, opposite from and asymmetric to the data layer.

Moreover, according to an embodiment thereof, the invention may provide an asymmetrically patterned magnetic memory storage device including: at least one magnetic memory cell, each cell characterized by: at least one ferromagnetic data layer of a first size, the data layer characterized by an alterable orientation of magnetization; an intermediate layer in contact with the data layer; and at least one ferromagnetic reference layer of a second size, the reference layer characterized by a reference magnetic field, the reference layer in contact with the intermediate layer, opposite from and asymmetric to the data layer.

Further, according to an embodiment thereof, the invention may provide an asymmetrically patterned magnetic memory storage device including: at least one magnetic memory cell, each cell characterized by: at least one ferromagnetic data layer of a first size having a first end, a second end and a length along a longitudinal axis therebetween, and further characterized by an alterable orientation of magnetization along the longitudinal axis, the alterable magnetization having a North pole and a South pole aligning to each end of the data layer; an intermediate layer in contact with the data layer; and a ferromagnetic reference layer of a second size in contact with the intermediate layer, opposite from and asymmetric to the data layer, the reference layer having a first end, a second end, and a length along a longitudinal axis therebetween, and further characterized by a reference magnetic field along the longitudinal axis, the reference magnetic field having a North pole and a South pole aligning to each end of the reference layer.

In yet another embodiment, the invention may provide an asymmetrically patterned magnetic memory storage device including: a plurality of parallel electrically conductive rows; a plurality of parallel electrically conductive columns transverse to the rows, the columns and rows thereby forming a cross point array with a plurality of intersections; a plurality of magnetic memory cells, each memory cell located at an intersection between a row and column, each cell characterized by: at least one ferromagnetic data layer of a first size having a first end, a second end and a length along a longitudinal axis therebetween, and further characterized by an alterable orientation of magnetization along the longitudinal axis, the alterable magnetization having a North pole and a South pole aligning to each end of the data layer; an intermediate layer in contact with the data layer; and a ferromagnetic reference layer of a second size in contact with the intermediate layer, opposite from and asymmetric to the data layer, the reference layer having a first end, a second end, and a length along a longitudinal axis therebetween, and further characterized by a reference magnetic field along the longitudinal axis, the reference magnetic field having a North pole and a South pole aligning to each end of the reference layer.

In still another embodiment, the invention may provide a computer system including: a main board; at least one central processing unit (CPU) coupled to the main board; and at least one memory store joined to the CPU by the main board, the memory store having at least one memory cell, each memory cell including; at least one ferromagnetic data layer of a first size having a first end, a second end and a length along a longitudinal axis therebetween, and further characterized by an alterable orientation of magnetization along the longitudinal axis; an intermediate layer in contact with the data layer; and a ferromagnetic reference layer of a second size in contact with the intermediate layer, opposite from and asymmetric to the data layer, the reference layer having a first end, a second end, and a length along a longitudinal axis therebetween, and further characterized by a reference magnetic field along orientation of magnetization along the longitudinal axis.

These and other objects, features and advantages of the preferred method and apparatus will become apparent from the following detailed description, taken in conjunction with the accompanying drawings which illustrate, by way of example the principles of the invention.

DETAILED DESCRIPTION

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory.

Figure 3A:
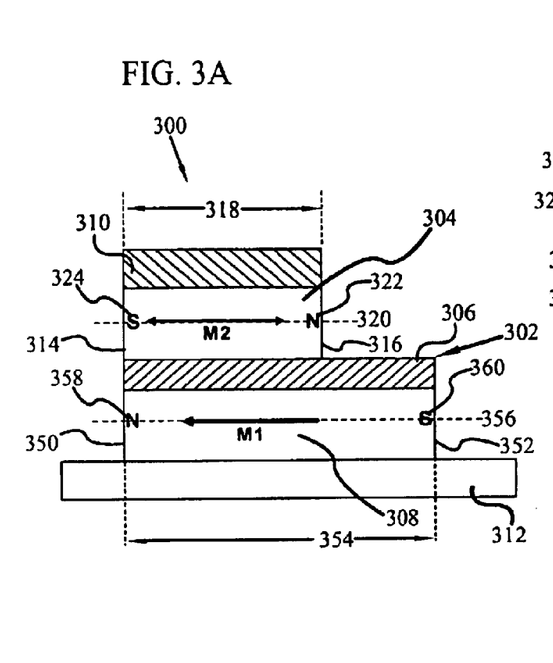
FIG. 3A is a plain view of an asymmetrically patterned magnetic memory according to a preferred embodiment of the present invention.
Figure 5:
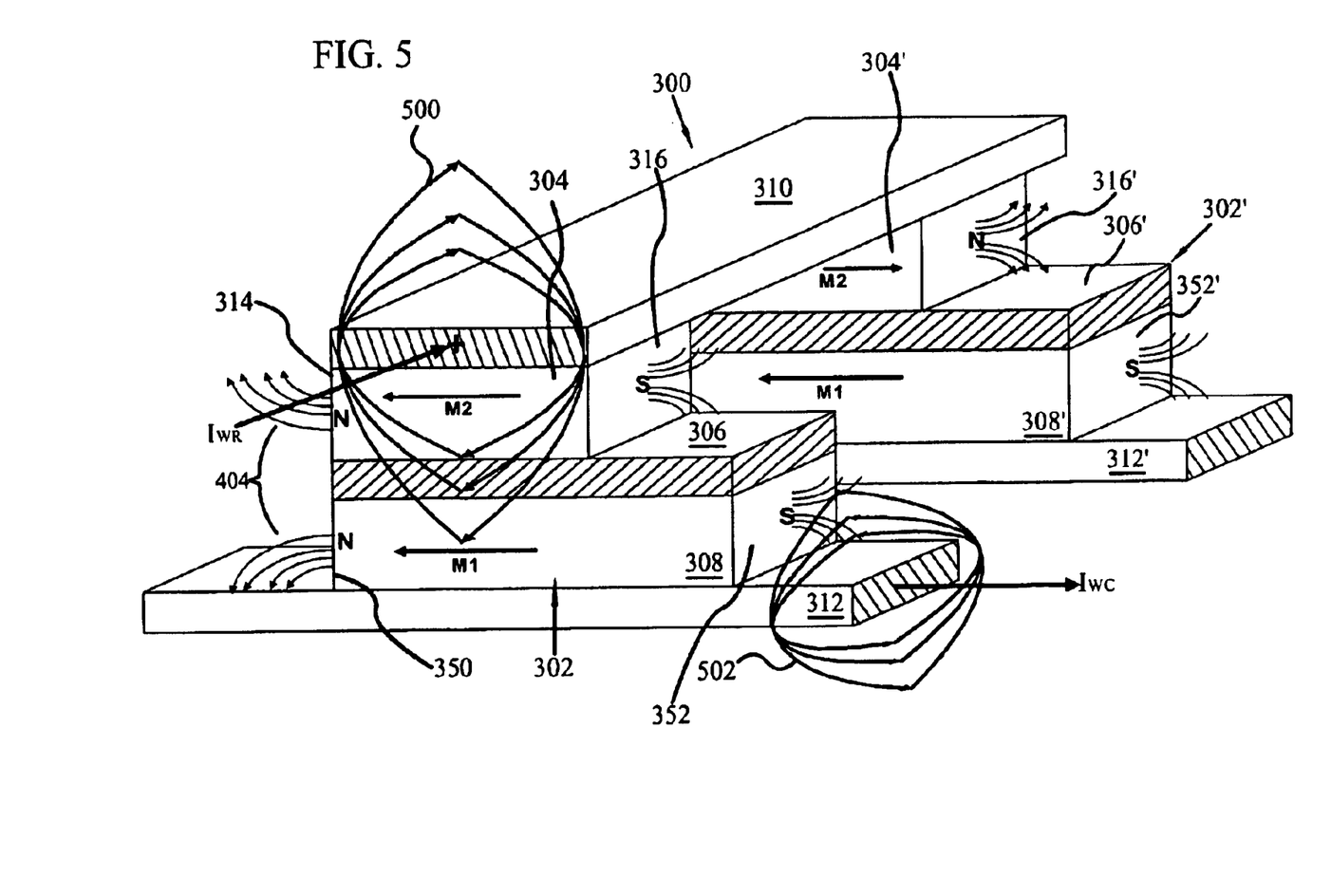
FIG. 5 is a perspective view illustrating a portion of a cross-point memory array consisting of the asymmetrically patterned memory of FIG. 3A.

Referring now to the drawings, and more particularly to FIG. 3A, there is shown a portion of an asymmetrically patterned magnetic memory 300 comprising at least one magnetic tunnel junction memory cell 302 (MTJ), according to an embodiment of the present invention. More specifically MTJ 302 has at least one ferromagnetic data layer 304 of a first size, an intermediate layer 306 in contact with the data layer 304, and a ferromagnetic reference layer 308 of a second size with orientation of magnetization M1. To achieve a magnetic memory storage device such as MRAM, the MTJ 302 may be placed in electrical contact with an electrically conductive row 310 transverse to an electrically conductive column 312. FIG. 5 illustrates a portion of such a cross point array as may be employed in an MRAM configuration.

With respect to FIG. 3A, the ferromagnetic data layer 304 permits the storing of a bit of data as an alterable orientation of magnetization M2. The intermediate layer 306 has opposing sides such that the data layer 304 in contact with one side is in asymmetrical vertical alignment with, and substantially uniformly spaced from, the reference layer 308, in contact with the second side of the intermediate layer 306.

The data layer 304 of a first size has a first end 314 and a second end 316 and a length 318 along a longitudinal axis 320 therebetween. The alterable orientation of magnetization M2 is substantially parallel to longitudinal axis 320, also known as the easy axis. More specifically, in at least one embodiment the magnetic field M2 is substantially symmetric about the longitudinal axis 320 of the data layer 304. In addition, in at least one embodiment, the data layer 304 is a substantially planar parallelogram with right angles.

The field of M2 has a positive pole (also referred to as a North pole 322) and a negative pole (also referred to as a South pole 324). The North pole 322 and South pole 324 are opposite from one another. When the North pole 322 is aligned to the second end 316 the South pole 324 is aligned to the first end 314, and vis-a-versa when M2 is reversed.

The reference layer 308 of a second size has a first end 350 and a second end 352 and a length 354 along a longitudinal axis 356 therebetween. The reference field of magnetization M1 is substantially parallel to the length 354, also know as the easy axis. More specifically, in at least one embodiment the magnetic field M1 is substantially symmetric about the longitudinal axis 356 of the reference layer 308. In addition, in at least one embodiment, the reference layer 308 is a substantially planar parallelogram with right angles.

The field of M1 has a positive pole (also referred to as a North pole 358) and a negative pole (also referred to as a South pole 360). The North pole 358 and South pole 360 are opposite from one another. When the North pole 358 is aligned to the first end 350 the South pole 360 is aligned to the second end 352. This alignment is reversed if the reference field M1 is reversed.

Figure 3B:
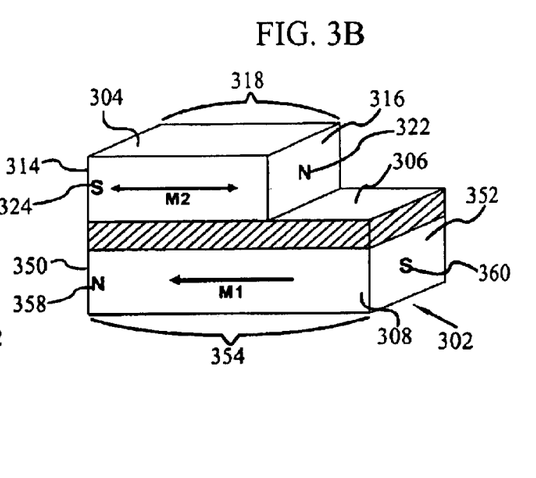
FIG. 3B is a perspective view of the asymmetrically patterned memory cell of FIG. 3A.
Figure 3C:
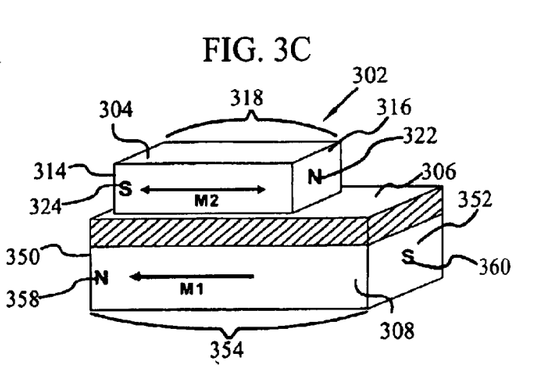
FIG. 3C is an alterative embodiment of an asymmetrically patterned magnetic memory cell of FIG. 3A.

As shown, more completely in the perspective view of FIG. 3B, the data layer 304 is smaller than the reference layer 308. Although the illustration depicts a smaller size due to a difference in length (the length 318 of the data layer 304 being shorter than the length 354 of the reference layer 308), under appropriate circumstances the other dimensions of width and/or height may be smaller as well, see FIG. 3C. As the data layer 304 is smaller in length 318, one and only one pole of the data layer 304 and one and only one pole of the reference layer 308 (a set of poles) may be substantially proximate to one another as the data layer 304 and reference layer 308 are asymmetrically stacked. In addition, the first end 314 of the data layer 304 is substantially vertically aligned with the first end 350 of the reference layer 308. More specifically, in at least one embodiment, the alignment of the first end 314 of the data layer 304 is flush with the first end 350 of the reference layer 308. In an alternative embodiment as shown in FIG. 3C, the first end 314 of the data layer 304 is proximate to, but not flush with the first end 350 of the reference layer 308.

Figure 4A:
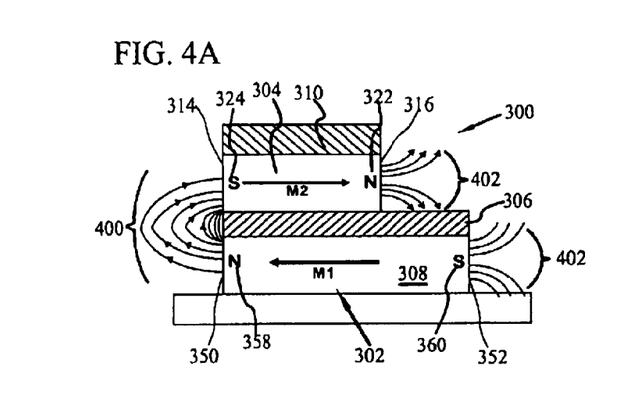
FIG. 4A is a plain view of anti-parallel magnetic fields in the asymmetrically patterned memory of FIG. 3A.
Figure 4B:
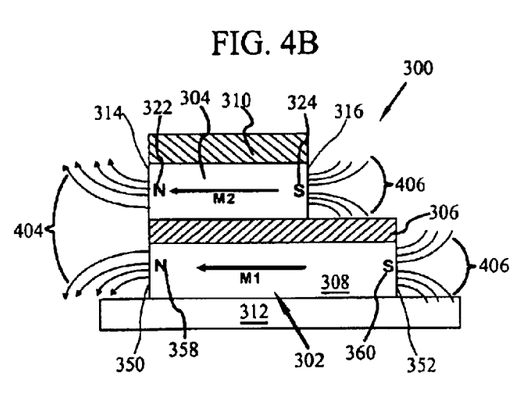
FIG. 4B is a plain view of parallel magnetic fields in the asymmetrically patterned memory of FIG. 3A.
Figure 4C:
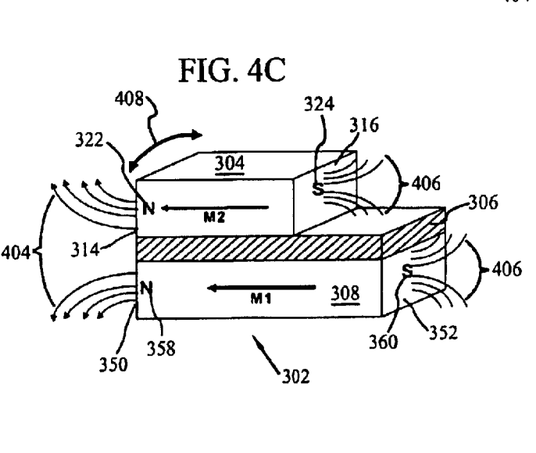
FIG. 4C is a perspective view of anti-parallel magnetic fields in the asymmetrically patterned memory cell of FIG. 3A.

The advantageous result of the asymmetric alignment is conceptually illustrated in FIGS. 4A through 4C. As shown, the asymmetric alignment achieves a MTJ 302 wherein only one pole of the data layer 304 and one pole of the reference layer 308 are in substantially vertical proximate alignment. As such, these vertically proximate, substantially aligned poles substantially influence one another, while the non-vertically aligned poles do not substantially influence one another. This configuration within the MTJ 302 may be described simplistically as "one-end involvement."

In the instance case shown in FIG. 4A, M2 and M1 are anti-parallel. In this configuration, the South pole 324 of the data layer 304 is aligned to the first end 314 of the data layer 304. The South pole 324 is therefore substantially aligned and proximate to the North pole 358 of the reference layer 308. A strong attractive magnetic force as represented by arrows 400 exists between the first ends (314 and 350) the data layer 304 and the reference layer 308. As the second ends (316 and 352) are not substantially aligned, relative to the first ends (314 and 350) the attractive force, represented by arrows 402, is minimal.

In the instance case shown in FIG. 4B, M2 and M1 are parallel. In this configuration the North pole 322 of the data layer 304 is aligned to the first end 314 of the data layer 304. The North pole 322 is therefore substantially aligned and proximate to the North pole 358 of the reference layer 308. A strong repelling magnetic force as represented by arrows 404 exists between the first ends (314 and 350) the data layer 304 and the reference layer 308. As the second ends (316 and 352) are not substantially aligned, relative to the first ends (314 and 350) the repelling force, represented by arrows 406, is minimal. As shown in the perspective view of FIG. 4C, advantageously over the prior art, the aligned North pole 322 of the data layer 304 exhibits a strong repulsive force and a desire to swing out of alignment (represented by arrow 408), whereas the South pole 324 of the data layer 304 remains respectively passive.

To perform a write operation upon the data layer 304 of MTJ 302, a magnetic field is applied sufficient to overcome the coercitivity of the data layer 304. Whereas in the prior art the applied magnetic field also was required to content with two sets of magnetic poles desiring or resisting the reorientation of M2, under the asymmetric patterning as shown in FIGS. 4A–4C, the write field need only be sufficient to overcome the coercitivity of M2 in the data layer 304 and align one set of poles. More specifically, where a write operation creates a parallel alignment between M1 and M2, a magnetic field is applied to overcome the coercitivity of the data layer 304 and align the data layer North pole 322 at the data layer first end 314 with the reference layer North pole 358 at the reference layer first end 350. In an alternative embodiment, where a write operation creates a parallel alignment between M1 and M2, a magnetic field is applied to overcome the coercitivity of the data layer 304 and align the data layer South pole 324 at the data layer first end 314 with the reference layer South pole 360 at the reference layer first end 350.

The one-end involvement of the asymmetric alignment of the data layer 304 and reference layer 308 permits different thresholds in the write magnetic field strength required to shift M2 from anti-parallel to parallel and from parallel to anti-parallel. Such difference in thresholds permits the MTJ 302 to advantageously operate as a multiple state cell.

The ability of the asymmetrically patterned magnetic memory 300 to store data is exemplified in FIG. 5. The write magnetic field may be achieved by passing an externally supplied write current $I_{WR}$ of a predetermined magnitude and direction through conductor row 310 resulting in the generation of a magnetic field (represented by curved arrows 500). In addition, an externally supplied write current $I_{WC}$ of a predetermined magnitude and direction is supplied through column 312 resulting in the generation of a magnetic field (represented by curved arrows 502).

As shown, the write current $I_{WR}$ of the row 310 is flowing into the page, indicated by the "+" symbol, such that the magnetic field 500 has a vector in the clockwise direction in accordance with the right-hand rule. The write current $I_{WC}$ of the column 312 is flowing along the page such that the magnetic field 502 of the column 312 cooperatively interacts with the magnetic field 500 of the row 310. The magnetic fields 500 and 502 are not sufficient, individually to overcome the coercivity of the data layer 304 of a MTJ 302 not located at the cross point intersection of the row 310 and column 312.

The reference layer 308 may be a pinned or soft reference layer. In at least one embodiment the reference layer 308 is a soft reference layer, so named because the direction of orientation of magnetization M1 can be dynamically set to a known direction. Such dynamic setting may be achieved by magnetic fields provided by an externally supplied current flowing through the row 310 and column 312 intersecting at MTJ 302. In this case, the current magnitude applied to the row 310 and the column 312 to set the magnetization M1 of the soft reference layer 308 to a known direction is relatively small. This current will not alter the magnetization state M2 of the data layer 304 or other unselected memory cells.

Generally, this event occurs during a read cycle when the magnetization M1 of the reference layer 308 is set to a known direction and then compared with the direction of M2 of the data layer 304 to determine the "0" or "1" state of the memory bit cell. It is termed "soft" because it generally comprises materials that are magnetically soft and are not of the usual hard-pinned materials used for more traditional pinned reference layers. When utilizing a soft reference layer, a convention is generally adopted as to which way M1 will be oriented.

The use of a soft reference layer may have several advantageous benefits in the MTJ 302. As a soft reference layer is not substantially fixed in orientation, it may not be necessary to subject the MTJ 302 to high temperatures during manufacturing as is often required to establish a fixed reference layer. In addition, the lack of a substantial and constant magnetic field in the reference layer reduces the likelihood of a demagnetization field from the reference layer acting upon the data layer, thus reducing the offset in the coercive switching field.

The ferromagnetic data layer 304 has a lower coercitivity then the reference layer 308, and may be made from a material that includes, but it not limited to: Nickel Iron (NiFe), Nickel Iron Cobalt (NiFeCo), Cobalt Iron (CoFe), and alloys of such metals. In addition, both the reference layer 308 and the data layer 304 may be formed from multiple layers of materials. However, for conceptual simplicity and ease of discussion, each layer component is herein discussed as a single layer.

The phenomenon that causes the resistance in the MTJ 302 is well understood in the magnetic memory art and is well understood for TMR memory cells. GMR and CMR memory cells have similar magnetic behavior but their magneto-resistance arises from different physical effects as the electrical conduction mechanisms are different For instance, in a TMR-based memory cell, the phenomenon is referred to as quantum-mechanical tunneling or spin-dependent tunneling. In a TMR memory cell, the intermediate layer 306 is a thin barrier of dielectric material through which electrons quantum mechanically tunnel between the data layer 304 and the reference layer 308.

In a GMR memory cell, the intermediate layer 306 is a thin spacer layer of non-magnetic but conducting material. Here the conduction is a spin-dependent scattering of electrons passing between the data layer 304 and the reference layer 308 though the intermediate layer 306. In either case, the resistance between the data layer 304 and the reference layer 308 will increase or decrease depending on the relative orientations of the magnetic fields M1 and M2. It is that difference in resistance that is sensed to determine if the data layer 304 is storing a logic state of "0" or a logic state of "1".

In at least one embodiment, the intermediate layer 306 is a tunnel layer made from an electrically insulating material (a dielectric) that separates and electrically isolates the data layer 304 from the reference layer 308. Suitable dielectric materials for the dielectric intermediate layer 306 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 306 is a tunnel layer made from a non-magnetic material such as a 3d, a 4d, or a 5d transition metal listed in the periodic table of the elements. Suitable non-magnetic materials for a non-magnetic intermediate layer 306 may include, but are not limited to: Copper (Cu), Gold (Au) and Silver (Ag). While the actual thickness of the intermediate layer 306 is dependent upon the materials selected to create the intermediate layer 306 and the type of tunnel memory cell desired, in general, the intermediate layer 306 may have a thickness of about 0.5 nm to about 5.0 nm.

It is understood and appreciated that although the above discussions have pertained generally to magnetic memory cells 302, the discussions pertaining to the structure carry over to magnetic read devices such as read heads for hard drives, or any other magnetic field read sensor. In such a setting the data layer 304 is termed a sense layer and is oriented by a magnetic field emanating from a storage bit, rather than from a field provided by, for example a row 310 and a column 312. Indeed the one-end involvement of asymmetric patterning advantageously permits the sense layer (otherwise known as the data layer 304) to respond to smaller magnetic fields and/or degraded fields.

Another embodiment may be appreciated to be a computer system incorporating the asymmetrically patterned magnetic memory 300. A computer with a main board, CPU and at lest one memory store comprised of an embodiment of the asymmetrically patterned magnetic memory 300 described above raises the advantages, of the improved MTJ's 302 to a system level.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A computer system comprising:

a main board;

at least one central processing unit (CPU) coupled to the main board; and at least one memory store joined to the CPU by the main board, the memory store having a plurality of memory cells, each memory cell including;

at least one ferromagnetic data layer of a first size having a first end, a second end and a length along a longitudinal axis therebetween, and further characterized by an alterable orientation of magnetization along the longitudinal axis;

an intermediate layer in contact with the data layer; and a ferromagnetic reference layer of a second size in contact with the intermediate layer, opposite from and asymmetric to the data layer, the reference layer having a first end, a second end, and a length along a longitudinal axis therebetween, and further characterized by a reference magnetic field along orientation of magnetization along the longitudinal axis.

2. The computer system of claim 1, wherein the interaction between the poles of the data layer and the poles of the reference layer may be characterized as one-end involvement.

3. The computer system of claim 1, wherein the magnetic field of the data layer is substantially symmetric about the longitudinal axis.

4. The computer system of claim 2, wherein the data layer is a substantially planar parallelogram with right angles.

5. The computer system of claim 1, wherein the data layer is smaller than the reference layer.

6. The computer system of claim 5, wherein the first end of the data layer is substantially vertically aligned with the first end of the reference layer.

* * * * *